(12) United States Patent
Linder et al.

(10) Patent No.: US 12,148,849 B2
(45) Date of Patent: Nov. 19, 2024

(54) OBTAINING A PV FILM STRUCTURE BY MEANS OF A ROOM TEMPERATURE METHOD AND ROOM TEMPERATURE METHOD FOR PRODUCING A PV FILM STRUCTURE

(71) Applicant: DYNAMIC SOLAR SYSTEMS AG, Frankfurt (DE)

(72) Inventors: Patrick Linder, Lehrberg (DE); Daniel Linder, Lehrberg (DE)

(73) Assignee: DYNAMIC SOLAR SYSTEMS AG, Frankfurt (DE)

( * ) Notice: Subject to any disclaimer, the term of this patent is extended or adjusted under 35 U.S.C. 154(b) by 0 days.

(21) Appl. No.: 17/515,474

(22) Filed: Oct. 31, 2021

(65) Prior Publication Data
US 2022/0052214 A1    Feb. 17, 2022

Related U.S. Application Data

(63) Continuation of application No. 15/554,055, filed as application No. PCT/DE2016/100084 on Feb. 26, 2016, now abandoned.

(30) Foreign Application Priority Data

Feb. 26, 2015 (DE) .......... 10 2015 102 801.8
Dec. 2, 2015 (DE) .......... 10 2015 015 435.4
Dec. 6, 2015 (DE) .......... 10 2015 015 600.4

(51) Int. Cl.
H01L 31/02    (2006.01)
H01G 9/20    (2006.01)
H01L 21/02    (2006.01)
H01L 31/046    (2014.01)

(52) U.S. Cl.
CPC ........ *H01L 31/046* (2014.12); *H01G 9/2004* (2013.01); *H01G 9/2095* (2013.01); *H01L 21/02422* (2013.01); *H01L 21/02601* (2013.01); *H01L 21/02628* (2013.01); *H01L 31/02* (2013.01)

(58) Field of Classification Search
CPC ... H01L 33/502; H01L 33/486; H01L 33/644; H01L 31/046; H01L 21/02422
USPC .............................. 257/98; 136/243
See application file for complete search history.

(56) References Cited

U.S. PATENT DOCUMENTS

| | | | | |
|---|---|---|---|---|
| 8,043,909 B2* | 10/2011 | Ebbers | ............ | H01L 21/02581 438/960 |
| 8,648,253 B1* | 2/2014 | Woods | ............... | H01L 31/0749 136/265 |
| 2006/0180197 A1* | 8/2006 | Gui | ............ | H01G 9/2072 257/E25.007 |
| 2006/0199313 A1* | 9/2006 | Harting | ............... | H01L 31/202 257/E27.125 |
| 2008/0245413 A1 | 10/2008 | Ruan et al. | | |
| 2009/0120491 A1* | 5/2009 | Berson | ................... | H10K 30/30 977/735 |
| 2010/0139750 A1* | 6/2010 | Kim | ................... | H01L 31/0392 977/948 |
| 2011/0005589 A1* | 1/2011 | Chianelli | .................. | E01C 9/00 136/265 |
| 2011/0041903 A1* | 2/2011 | Zehavi | ............ | H01L 31/022425 136/255 |
| 2011/0140091 A1* | 6/2011 | Friend | .................... | H10K 30/15 257/E51.027 |
| 2012/0060893 A1* | 3/2012 | Shima | ................ | H01L 31/0687 136/244 |
| 2013/0196465 A1* | 8/2013 | Dong | ............. | H01L 31/022425 252/512 |
| 2013/0206225 A1* | 8/2013 | Zinn | ................... | H01L 31/1804 977/773 |
| 2013/0276874 A1* | 10/2013 | Brabec | .................. | H10K 30/57 136/255 |
| 2014/0061701 A1* | 3/2014 | Matsuura | .............. | H01L 31/056 428/141 |
| 2014/0360572 A1* | 12/2014 | Kwon | ............ | H01L 31/022433 136/256 |
| 2015/0228815 A1* | 8/2015 | Tsai | ................... | H01L 31/0749 438/71 |
| 2015/0287843 A1* | 10/2015 | Cheng | .................. | H01L 31/046 438/95 |

FOREIGN PATENT DOCUMENTS

DE    102012107100 A1    2/2014
JP    2014088559 A    8/2016

* cited by examiner

*Primary Examiner* — Sheikh Maruf
(74) *Attorney, Agent, or Firm* — Rivka Friedman

(57) ABSTRACT

The invention provides a suitable method and an appropriate, PV film structure. This aim is achieved by a room temperature method in which aqueous dispersions are printed onto a substrate and cured by an accompanying reaction. The accompanying reaction forms gradients and also nanoscale structures at the film boundaries, which produce a PV active film having standard performance and a higher stability. At around 10% efficiency, stability and no initial loss in performance in the climatic chamber test can be obtained and over a 20 year test period, consistently less fluctuation can be achieved. The method is free from tempering or sintering steps, enables the use of technically pure, advantageous starting materials and makes the PV film structure available as a finished, highly flexible cell for a fraction of the typical investment in production or distribution.

19 Claims, No Drawings

OBTAINING A PV FILM STRUCTURE BY MEANS OF A ROOM TEMPERATURE METHOD AND ROOM TEMPERATURE METHOD FOR PRODUCING A PV FILM STRUCTURE

TECHNICAL FIELD

The present invention may generally be classified in the field of electrotechnical thin layers. The technical field is usefully outlined in DE 10 2015 102 801 in which the present inventors have been involved. Known measures, features and methods may be discerned from this application and the prior art cited therein.

DESCRIPTION OF THE PRIOR ART

The present invention relates to a PV layer sequence obtained by a room temperature process and to the room temperature process for producing a PV layer sequence according to the preambles of the independent claims.

From a commercial standpoint it is an essential feature that production is effected at room temperature. This reduces the process engineering costs of production markedly and provides a substantial advantage in production. However, this also means layers precisely sintered at elevated temperature or deliberately compacted cannot be present in the PV layer sequence. Yet, the deliberately adjusted nanoscale planarity of a photovoltaically active layer composite is a performance-determining feature of established PV systems: PV layers are often precisely adjusted here by vacuum plasma processes to ensure a sufficient energy yield. Room temperature processes generating thin layers—i.e. solid, uninterrupted layer sequences—by printing, flow coating or spin coating—i.e., by mechanical measures—often cannot adjust planarities in the nanometer range in a controlled fashion. The layers are uneven and often flat only in the micrometer range. The disadvantage of uneven layers that are flat only in the micrometer range is that they can use an areal PV junction, established on a nanoscale by doping, for power generation only with considerable losses. The inventors consider this to explain why in the field of commercial photovoltaic production technology only very few documents and approaches are seriously concerned with RI production processes (RT=room temperature).

JP 042 49 379 A describes a PV apparatus and a process for the production thereof, wherein by CVD methods (CVD=chemical vapor deposition, i.e. the gas phase helps to force a chemical reaction) under negative pressure various reactions comprising deposition and etching processes are undertaken in order thus initially to form the high-planarity, areal PV base structure. The disadvantage here is that the vacuum reaction chamber necessitates expensive batch processing: in a vacuum reaction chamber it is always only a certain number of substrates that can be charged, then evacuated and optionally dried and finally after coating under reactive gas removed again. Another disadvantage is that the substrates to be coated must be held at precisely adjusted temperatures during coating so that reactive formation of the same type and thickness of layer is always achieved. Furthermore, this document teaches subsequent printing with a Cu electrode paste which must be baked, i.e. the layer composite must be subjected to high temperatures in the context of contacting, wherein both the layers of the PV-active layer and the layers intended to form the electrodes are compacted and sintered to afford a sufficiently electrically conductive and contacted overall cell. It is precisely the disadvantageous thermal compacting step which results in high costs and disadvantages because at sintering temperatures, which sinter copper pastes into a conductor track, impurities and the smallest contaminants are likewise subject to diffusion. As a result, for such production methods expensive, high-purity reactants which even in the final sintering step comprise no impurities must be used because the impurities would otherwise finally diffuse into the PV-active layer and weaken or even completely destroy said layer.

In the same vein, CA 2 467 690 A1 proposes a printable hot melt adhesive mixture which may be applied to electrotechnical thin layer sequences, in particular PV layer sequences, as an electrode structure and/or contact. The conductivity paste contains conductive lead glass particles which take up silver or aluminum flakes on their surface; this base mixture is fixed A with a thermoplastic matrix. However, the disadvantage here too is that all organic fractions must finally be baked out at 650° C. to 900° C. because otherwise neither sufficient conductivity nor the stability of the layer are ensured.

CN 10 329 3600 A discloses in its abstract a process for forming optical layers which provide for targeted inward or outward passage of light and are suitable for PV or display apparatuses. Here, a polymer layer is printed in the desired arrangement and spatial configuration onto a polyimide layer and subsequently heated to polymerization temperature. By targeted arrangement and modification of molecule chains the refractive index of the optical layer may be directionally adjusted so that the optical top layer does not require final etching or structuring. The disadvantage here too is that a final heating to ensure complete polymerization is provided. This document furthermore provides no indications of whether and how such methods could be applied to a complete PV layer composite, in particular on a PV-active layer or layer combination.

In the same vein, TW 2014 42 271 A discloses in its abstract a sealing system for PV modules where a PV module is provided on a substrate and via an inkjet printing station encapsulated with UV-hardening adhesive in various colors at room temperature and simultaneously sealed in secure combination with the substrate. The disadvantage here too is the use of a customary, established PV-active layer as the module, i.e. a production process for the current-providing, PV-active layer is effected in established and costly fashion with the previously described disadvantages.

CN 10 321 434 0 A discloses in its abstract a triptycene system which may be provided as a nanoscale, aqueous dispersion via a sol-gel process. The aqueous dispersion can provide agglomerates of triptycene of 50 nm to 200 µm in size and thus provide semiconductor properties which are printable in predetermined regions via the aqueous dispersion.

The term 'printable' comprehends—also in the context of the present invention—customary printing systems such as airbrush printing heads, inkjet printing heads electrostatic spray application of paints or color pigments, pad printing, lithographic printing, flexographic printing, offset printing right up to thermal sublimation printing which can apply pigment inks via a meltable thermoplastic base.

The disadvantage is that triptycene comprises benzene groups; it is derived from dehydrobenzene and anthracene. Such systems often comprise byproducts which over time slowly outgas from the matrix of the main product. Hence, such organic, electrotechnical thin layers often do not exhibit long-term stability, show strong initial deterioration of electrotechnical properties in their corrosion behavior, and contain declarable components such as benzene which outgas from the layer composite as volatile organic components, often abbreviated to VOC, endanger those present and can additionally compromise or even destroy adjacent layers.

CN 103 839 605 discloses in its abstract a conductivity dispersion on a silver and graphene basis, wherein this basis is dispersed in an organic resin with crosslinkers and diluents and is thus provided as a printable, organic paste. The disadvantage is that resins are only roughly adjusted to an average molar mass; they often comprise VOC fractions and often potentially carcinogenic benzenes and derivatives thereof. In addition adhesives containing diluents are dispersion adhesives: they harden by evaporation of the diluents/solvent which cannot take place rapidly and completely at room temperature and thus entails a long-term and continuous evaporation of the diluents. Incomplete hardening and the danger of long-term VOC release are known and typical disadvantages of such resin systems.

The problem addressed by the present invention is accordingly that of overcoming the disadvantages of the prior art and providing a process and an electrotechnical thin layer according to the process which despite an industrial process at room temperature and large-area fabrication can offer thin layers providing a PV-active layer in a finished, contactable layer composite.

The solution to this problem proceeds according to the of the independent claims. Advantageous embodiments are discernible from the dependent claims and the description which follows.

SUMMARY OF THE INVENTION

The invention provides a PV layer sequence obtained by a room temperature process where the PV layer sequence was printed as a thin layer sequence at least including contact electrodes at room temperature in a continuous printing process, at least one aqueous solution and/or mixture comprising electrically conducting and/or semiconducting, inorganic agglomerates was applied by printing and by concomitant chemical reaction hardened to afford a PV-active layer, wherein in turn during the reaction nanoscale structures comprising at least one structure selected from the group consisting of chains, networks, network-tubes, vacancies, pores were formed in the PV layer sequence.

The corresponding room temperature process for producing electrotechnical PV thin layers where electrically conducting and/or semiconducting, inorganic agglomerates are provided areally in a dispersion and hardened to afford a layer is characterized in that the hardening is performed at room temperature and the hardening is accelerated by treatment with at least one reagent to form a PV layer sequence.

DESCRIPTION OF THE INVENTION AND ADVANTAGEOUS FEATURES

The PV layer sequence according to the invention is obtainable by the presently claimed process. The process has already been presented by the inventors in the context of DE 10 2015 102 801 A, the process engineering teaching or which is also claimed here by priority. In continuous development of the process the inventors also encountered additional products of value. These—as described in DE 10 2015 01 54 35 A1 and in DE 10 2015 015 600 A1—are also claimed for the present method of production in the context of the complementary process engineering measures.

The PV layer sequence according to the invention is obtained by a room temperature process. 'Room temperature' is in the range acceptable and customary for human beings, i.e. may be roughly outlined as 0 degrees Celsius to 60 or 70 degrees Celsius and in the European region is around 25 degrees Celsius+−5 degrees Celsius. The PV layer sequence is formed as a thin-layer sequence at this temperature.

'Thin layer' comprehends in the context of the present invention layers in the micrometer range whose layer thicknesses may usefully be reported in micrometers and deviate by not more than two orders of magnitude.

The PV layer sequence is printed at least including contact electrodes at room temperature in a continuous printing process. This forms a finished PV layer sequence which merely requires connection to an existing system to be able to accept and utilize photovoltaic current.

In the context of the production process at least one aqueous solution and/or mixture comprising electrically conducting and/or semiconducting, inorganic agglomerates is applied by printing and by concomitant chemical reaction hardened to afford a PV-active layer. The printing of a reactive solution or mixture brings about an extreme shortening of the hardening time and for the first time production times such as are known from the industrial printing sector are obtainable. The inventors furthermore believe that hardening typically proceeds most rapidly at the surface of a thin layer and therefore builds up a gradient in the thin layer itself which can usefully explain the electrotechnical properties: for conducting and/or semiconducting agglomerates a gradient of vacancies and/or reaction products can bring about an electrochemical motive force which can usefully explain that layers produced in this way separate charges better, support PV effects at P-N junctions and can also exhibit diode-like properties. In addition in the PV thin layer during the reaction nanoscale structures comprising at least one structure selected from the group consisting of chains, networks, network-tubes, vacancies, pores were formed in the PV layer sequence. It is particularly advantageous here when both a reactive hardening and a reaction forming nanoscale structures are performed simultaneously. This allows not only nanoscale structure gradients but also concentration gradients and size distributions for nanostructural elements to be established and the inventors consider this to explain why measurable electrotechnical properties indicate a plurality of excitation processes within a band gap. The low production temperature also brings an additional advantage: even for only technical-grade purity reactants (purities of 95% to 99%, preferably 99%+−0.5%, in large-scale industrial manufacture) functioning, stable PV layer sequences can be obtained since the P-N junctions printed and/or chemically generated in the course of production are not destroyed by diffusing impurities as a result of subsequent sintering. Furthermore, the inorganic base structure of the agglomerates which substantially form the layer sequence can explain the improved stability: thus-generated layer sequences, after a final, slightly acidic sealing at temperatures around 160 degrees Celsius, showed typical performance values which in the climate chamber test showed no initial degradation whatsoever; over 1000 hours specific PV layer sequence specimens were performance-stable which the inventors attribute to the stable inorganic agglomerate matrix. Not only in the required production plant but also in relation to the costs of the necessary materials the thus obtainable PV layer sequences are therefore obtainable for a fraction of the customary production cost and in comparison show markedly better long-term stability without initial degradation.

The thin layer sequence comprising the PV layer sequence according to the invention preferably comprises a PV-active layer which in the range from long wave to visible spectral range, preferably in the spectral range greater than 1200 cm, particularly preferably in the range from 1500 nm to 4000 nm, generates at least 4% of its open circuit voltage, preferably 5% to 18% of its open circuit voltage, particularly preferably 10+−4% of its open circuit voltage. If a P-N junction is formed by concomitant reaction as described hereinabove, nanostructures can additionally modify the band gap directly at the junction. Long, semiconducting to conducting nanostructures may be regarded as additional long-wave-adjusted quantum dots or wells which generate additional levels within the band gap. The inventors consider this to explain why production of thin layer sequences as disclosed in DP 10 2015 015 600 A1 which generate energy only from the long wave to the visible light spectrum has already been accomplished. Measures and accompanying products which at least partially make it possible for a PV layer sequence to utilize such long wave portions are also claimed in the present case.

The thin layer sequence comprising the PV layer sequence is preferably characterized in that the complete thin layer sequence is free from volatile organic components, contains no toxic heavy metals, preferably no selenium, arsenic, led, cadmium, indium, gallium as an additive or added dopant, the PV layer sequence has a terrestrial efficiency of at least 10+−4% and the PV layer sequence is appliable atop a paper-like, flexible carrier.

Volatile organic components comprise plasticizers, long-chain alcohols and polyannelated hydrocarbons which as long-chain and heavy molecules outgas over time and can damage both the cell and any human beings present.

Inorganic agglomerates are preferably free from toxic heavy metals, in particular selenium, arsenic, lead, cadmium, indium, gallium are not present as an additive or added dopant.

Specific specimens of the thus obtainable, particularly advantageous By layer sequences showed a terrestrial efficiency of at least 10+−4%. By use of blends and application technologies known from the printing sector the application on paper is the simplest and fastest option for manufacturing first test specimens. These specimens show a flexibility and stability which is otherwise typical only for print products. Since such print products may also be printed or transfer films and/or label films and only then finally applied atop the actual carrier the PV layer sequence may in the same vein be formed to be appliable atop a paper-like flexible carrier. Corresponding self-adhesive films having electrotechnical thin layers have already been produced.

The inventive room temperature process for producing electrotechnical PV thin layers where electrically conducting and/or semiconducting inorganic agglomerates are provided areally in a dispersion and hardened to afford a layer is characterized in that the hardening is performed at room temperature and the hardening is accelerated by exposure to at least one reagent, wherein a PV layer sequence is formed.

The process is preferably characterized in that a PV-active layer is formed on a carrier layer when a flowable mixture or solution is provided, applied in a thin layer, preferably applied by printing, and finally hardened by concomitant reaction supported by at least one measure, the at least one measure selected from the group consisting of UV irradiation, exposure to $CO_2$, exposure to acidic gases, exposure to basic gases, exposure to oxidative gases, exposure to reducing gases, exposure to acid chlorides, exposure to urea solutions, exposure to metal dispersion, exposure to metal carbonyls, exposure metal complex compounds, exposure to metal compounds, exposure to metal salts, exposure to water, exposure to drying agents, exposure to drying gas, exposure to inert gas, exposure to drying air.

The process is preferably characterized in that a PV-active layer is at least partly arranged on a carrier layer having at least one region comprising at least one layer selected from the group consisting of conductive copper layer, conductive graphite agglomerate layer, conductive silver agglomerate layer, conductive gold agglomerate layer, conductive metal oxide agglomerate layer, conductive glass agglomerate layer, conductive graphene layer, conductive CNT layer, conductive SWCNT layer, conductive MWCNT layer.

The process is preferably characterized in that the process is performed in a printing machine.

The process is preferably characterized in that a PV-active layer comprises an inorganic matrix having an interpenetrating organic network.

The process is preferably characterized in that the inorganic matrix comprises at least one agglomerate type, preferably oxidized agglomerate type, selected from the group consisting of silica agglomerates, basic silica agglomerates, acidic silica agglomerates, sodium waterglass agglomerates, potassium waterglass agglomerates, bromine agglomerates, iodine agglomerates, halogen agglomerates, carbon agglomerates, silicon agglomerates, germanium agglomerates, tin agglomerates, lead agglomerates, boron agglomerates, aluminum agglomerates, gallium agglomerates, indium agglomerates, phosphorus agglomerates, arsenic agglomerates, antimony agglomerates, sulfur agglomerates, selenium agglomerates, tellurium agglomerates, bismuth agglomerates.

The process is preferably characterized in that the organic matrix comprises at least one crosslinked component selected from the group consisting of polyamide component, polyacrylate component, polyol component, polyester component, polyhexoses component, polyamino acids component, swellable polyhexoses component, red algae extract, agar, corn starch, potato starch, starch, carrageenan, tragacanth, swellable polysaccharide, gum arabic, alginates, pectin, swellable polypeptide, gelatin, carboxymethyl cellulose, hydroxyethyl cellulose, polyacrylics, polycarboxylic acids, polyethers, polyamides, polyimides, organosilicon compound having a methacrylic-acid-based polymerizable side group, organosiloxane.

The process is preferably characterized in that as the concomitant reaction at least one reaction is performed which is selected from the group consisting of oxidation with a halogen, oxidation under UV irradiation, oxidation under UV irradiation with wavelengths of less than 385 nm, oxidation under UV irradiation with a deuterium lamp, oxidation under UV irradiation with a UV LED at 365 nm, oxidation with atmospheric oxygen, oxidation under UV irradiation with a mercury vapor lamp, oxidation under UV irradiation with wavelengths around 254 nm, oxidation under UV irradiation with wavelengths around 185 nm, crosslinking and oxidation under UV irradiation, liberation of organic acids by condensation, liberation of organic alcohols by condensation, liberation of alcohols by oxide formation.

The process is preferably characterized in that before or during the hardening nanoscale polyions are introduced, wherein the polyions comprise at least one type of polyions selected from the group consisting of polyhalide ions, interhalide ions, polysulfide ions, poly-iodine iodide ions, conjugated carbon ions, graphene ions, CNT ions.

The process is preferably characterized in that the length of the—preferably chain-like—polyions is adjusted to an average chain length.

The process is preferably characterized in that a PV-active layer comprises at least partially a type of carrier molecule, the carrier molecule selected from the group consisting of ion-accepting scaffold polymers, Li-ion accepting scaffold polymers, ion-exchanging resins, ion-exchanging polymers, ion-exchanging glasses, halogen-ion-exchanging glasses, halogen-ion-exchanging silicates, iodophores.

The process is preferably characterized in that a PV-active layer comprises at least one further sensitizer.

The process is preferably characterized in that a concomitant reaction of a PV-active layer applied to a conductive component comprises a surficial oxidation of a metallic component.

The process is preferably characterized in that the oxidation comprises at least one reaction selected from the group consisting of formation of CuI on particulate copper component, formation of Cu2O on a particulate copper component, formation of Ag2O on a conductive component, formation of ZnS on a metallic component, formation of SnO on a metallic component, formation of titanium-four oxide compounds on a conductive component, formation of titanium-four oxide compounds with low-valent metal oxide admixture.

DETAILED ELUCIDATION OF THE INVENTION BY REFERENCE TO EXEMPLARY EMBODIMENTS

In an advantageous embodiment the room temperature process for producing an electrotechnical PV-active thin-layer sequence, wherein electrically conducting and/or semiconducting inorganic agglomerates are provided areal) y in a dispersion and hardened to afford a layer is characterized in that.
the hardening is performed at room temperature
the hardening is accelerated by exposure to at least one reagent
the process is performed in a printing machine
a PV layer sequence is formed, wherein in turn
a PV-active layer is formed on a carrier layer when a flowable, aqueous mixture or solution provided,
the mixture or solution comprises at least one inorganic agglomerate type which is selected from the group consisting of silica agglomerates, basic silica agglomerates, acidic silica agglomerates, sodium waterglass agglomerates, potassium waterglass agglomerates, halogen agglomerates, iodine agglomerates, preferably a combination of silica agglomerate having an adjusted pH and halogen agglomerate,
wherein the mixture or solution comprises as a further constituent at least one organic, crosslinkable component whose crosslinkable molecule portion comprises at least one molecule portion selected from the group consisting of lactam portion, acrylic portion, polysaccharide portion, organosilicon compound having a polymerizable methacrylic-acid-based side group, organosiloxane, organosilyl acetate and
the mixture or solution is applied by printing in a thin layer and finally hardened by concomitant reaction supported by UV irradiation and exposure to drying gas, wherein the PV-active layer forms an inorganic matrix having an interpenetrating organic network.

In further advantageous embodiment the room temperature process for producing an electrotechnical PV-active thin layer sequence wherein electrically conducting and/or semiconducting inorganic agglomerates are provided areally in a dispersion and hardened to afford a layer, is characterized in that
in a printing machine a PV layer sequence is formed, wherein in turn
a PV-active layer is formed on a carrier layer when a flowable aqueous mixture or solution is provided
a mixture or solution with mutually reacting components is made up, applied by printing in a thin layer and finally by continuing reaction is hardened, wherein the PV-active layer forms an inorganic matrix having an interpenetrating organic network with crosslinking binder bridges.

In a further advantageous embodiment a PV layer sequence according to the invention was obtained as follows: at room temperature in the context of a printing process on a flexographic printing machine with a self-adhesive, two-ply label paper as the carrier and with a plurality of printing stations initially an at least partially metallic thin layer—presently a copper layer and/or a silver layer—was formed on a reductive graphite carbon layer on the paper as is described in DE 2015 01 54 35 A1.

As a further printing paste for the abovementioned machine or a mixture comprising electrically conducting and/or semiconducting inorganic agglomerates in a dispersion was made up as follows: as a secondary constituent a partially crosslinkable polysaccharide-starch ether was adjusted to a low pH with an ascorbic acid-hydrochloric acid mixture in dispersion. The pH was monitored via added color indicator. Subsequently, with the constant stirring remaining solid was dissolved in distilled water and admixed with a saccharide having a dextran proportion in order to adjust viscosity. The acidic to strongly acidic solution was admixed with silica as the main constituent and adjusted with sodium hydroxide to a strongly basic pH—i.e. until the color change of the indicator—with stirring. This causes the silica to coagulate/precipitate and form inorganic agglomerates. The strongly basic dispersion is made reductive by addition of a base-soluble metal, in the present example a small amount of fully dissolvable aluminum together with an identical amount of iodine potassium iodide. The potassium iodide undergoes concomitant dissolution to form a colored complex and allows monitoring of the solution kinetics of the aqueous dispersion both visually and via the conductivity of the mixture. The aqueous, still-reacting and reductive dispersion was passed as a printing paste into a subsequent printing station of flexographic printing machine. Consequently directly after printing of the metal layer the reductive paste is applied by printing. After print-application of the reductive dispersion the fresh, still-damp paste was dried under UV irradiation with a mercury vapor lamp and exposure to drying air. The UV irradiation at least partially decolorizes the iodine complex again, i.e. elemental iodine is liberated and during hardening undergoes concomitant reaction with the surrounding matrix and present chloride ions. Furthermore, the iodine—and likewise the chlorine—can react with the metal layer previously printed on the underside. The inventors believe that P-N junctions are thus formed directly at the metal layer and at the same time along the inorganic agglomerates corresponding junctions may be formed from the dissolved metal—in this case aluminum—and the liberated halogens. The complete process is performed in the flexographic printing machine. The PV-active layer is formed on the carrier layer having an at least partial metal layer. Variation of the amount of hydrochloric acid, potassium iodide and reductively dissolved metal has a significant effect on the efficiency and performance of the PV-active layer and allows optimization of the properties. The mixture or solution comprises as a further constituent the polysaccharide portion. The inventors believe that said portion as a secondary constituent forms an organic scaffold which also comprises and can support halogen agglomerates and interhalogen agglomerates. The PV-active layer printed in a thin layer and subsequently hardened by concomitant reaction supported by UV irradiation and exposure to drying gas has thus formed as the main constituent an inorganic matrix having an interpenetrating organic network as a secondary constituent. The PV layer sequence was contacted with room-drying conducting silver on the topside; printing with customary, self-adhesive electrodes and/or with layers as per the metal layer printed on the underside are alternatively also conceivable. It is crucial that the PV-active layer is not covered in order to ensure a sufficient PV conversion of light to current. The ready-contacted PV layer sequence was provided with lines and welded with an acrylate thermoplastic sheathing in a laminator. The thus-welded cell was investigated for efficiency according to established Si standards and showed an efficiency of 10+−4% at a low filling factor of around 0.3 to 0.4. The attainable potential of the presently produced cell is thus in the range between 10% and 20% efficiency. In a climate chamber test based on IEC standard 61215 the cell was exposed to strong sunlight having a UV proportion at 80° C. and high atmospheric humidity. No change in performance was observed over 1000 hours. Only after the laminate welding not optimized for outdoor use became detached and the humid atmosphere was in direct contact with the thin layer sequence for several hundred hours, a performance drop of less than 6% was observed. The inventors ascribe the high stability (no initial performance drop) and surprisingly stable performance even upon direct contact with a humid atmosphere to the inorganic base scaffold: the agglomerates have formed solid contact points and bridges among themselves. The matrix is extremely stable and hardly susceptible to sintering or corrosion processes. The crosslinked structure can also explain the high flexibility of the product obtained by print processes: the paper carrier may be rolled, bent and folded like a classical print product without the printed thin layer sequence exfoliating or flaking.

Supporting investigations regarding utilizable wavelengths have further revealed: Upon increasing output of a lightbulb radiation source the present cell showed markedly greater increases in output compared to a customary Si PV cell: while the Si cell provides only 0.5 to 1 percent more current at increased brightness the printed cell according to the invention provided several percent of additional output. Moreover, for a switched-off but still warm lightbulb the cell according to the invention showed a residual output of around 10% of the originally available open-circuit voltage, which reduced accordingly with falling lightbulb temperature. The inventors attribute these superior performance characteristics to the morphology and a modified band gap structure: at relatively intense light incidence the markedly greater surface of the printed agglomerates is able to convert more photons and the PV-active and nanoscale structures surficially arranged on the agglomerates render the present cell more tolerant toward a varied angle of incidence. Even at a severely slanted angle of incidence a markedly larger portion of the output may still be summoned as was the case for established available Si cells. Furthermore the residual efficacy arranged from the long wave to the visible light spectrum indicates quantum dots and/or closely spaced energy levels within the band gap which allow conversion of long wave photons. The inventors believe that the reactively formed nanoscale structures modify the band gap here. This can usefully explain why even in apparent darkness the above-described cell was able to provide a usable, constant residual output by means of a warm lightbulb.

INDUSTRIAL APPLICABILITY

The disadvantage of classical printed PV layer cells is that the production of these cells frequently calls for expensive vacuum preparations and thermal tempering or sintering steps, the thin, doped vacuum-layers being highly susceptible to corrosion and contamination.

The problem addressed was accordingly that of overcoming the disadvantages and providing a suitable process and an appropriate PV layer sequence.

The problem is solved by a room temperature process in which aqueous dispersions are applied by printing onto a substrate and hardened by concomitant reaction. The concomitant reaction forms gradients and also nanoscale structures at the layer boundaries which generate a PV-active layer having customary performance and high stability. Efficiencies of around 10% are achievable stably and without an initial performance drop in the climate chamber test and are available constantly with little variation over a 20 year test period.

The process is free from tempering or sintering steps, allows the use of technical-grade purity, cost-effective starting materials and makes the PV layer sequence available as a finished, highly flexible cell for a fraction of the typical capital costs of production or distribution. For the first time, PV layer sequences may be produced completely analogously to the manufacture of a print product. The invention thus offers extremely versatile applicability with regard to both production and use in all fields in which established PV thin layers were previously rejected as too expensive or too unstable.

What is claimed is:

1. A PV layer sequence obtained by a room temperature process without tempering or sintering steps wherein:
    on a flexographic printing machine
    using technical grade purity starting materials
(a) the PV layer sequence comprising a metallic component was printed as a thin layer sequence at least including contact electrodes at room temperature in a continuous printing process,
(b) at least one aqueous solution and/or mixing comprising electrically conducting and/or semiconducting inorganic agglomerates was applied by printing and by concomitant chemical reaction, comprising surfacial oxidation of the metallic component, hardened to afford a PV-active layer, wherein in turn
(c) during the reaction nanoscale structures comprising networks, at least one structure selected from the group consisting of chains, network tubes, vacancies, pores were formed in the PV layer sequence.

2. The thin layer sequence having a PV layer sequence as claimed in claim 1, comprising
    a PV-active layer which in the range from long wave to visible spectral range, in the spectral range from 1200 nm to 4000 nm, generates between 4% and 18% of its open circuit voltage.

3. The thin layer sequence having a PV layer sequence as claimed in claim 1 wherein the complete thin layer sequence is free from volatile organic components, contains no toxic heavy metals, the PV layer sequence has a terrestrial efficiency of at least 10±4%, the PV layer sequence is appliable atop a paper-like, flexible carrier.

4. A room temperature process for producing electrotechnical thin layers, in particular for producing thin layer sequences as claimed in claim 1 wherein electrically conducting and/or semiconducting inorganic agglomerates are provided areally in a dispersion and hardened to afford a layer, wherein that the hardening is performed at room temperature and the hardening is accelerated by exposure to at least one reagent a PV layer sequence is formed.

5. The process as claimed in claim 4, wherein a PV-active layer is formed on a carrier layer when a flowable mixture or solution is provided, applied in a thin layer, and finally hardened by concomitant reaction supported by at least one measure, the at least one measure selected from the group consisting of UV irradiation, exposure to CO2, exposure to acidic gases, exposure to basic gases, exposure to oxidative gases, exposure to reducing gases, exposure to acid chlorides, exposure to urea solutions, exposure to metal dispersion, exposure to metal carbonyls, exposure to metal complex compounds, exposure to metal compounds, exposure to metal salts, exposure to water, exposure to drying agents, exposure to drying gas, exposure to inert gas, exposure to drying air.

6. The process as claimed in claim 4, wherein a PV-active layer is at least partly arranged on a carrier layer having at least one region comprising at least one layer selected from the group consisting of conductive copper layer, conductive graphite agglomerate layer, conductive silver agglomerate layer, conductive gold agglomerate layer, conductive metal oxide agglomerate layer, conductive glass agglomerate layer, conductive graphene layer, conductive CNT layer, conductive SWCNT layer, conductive MWCNT layer.

7. The process as claimed in claim 4, wherein the process is performed in a printing machine.

8. The process as claimed in claim 4, wherein a PV-active layer comprises an inorganic matrix having an interpenetrating organic network.

9. The process as claimed in claim 8, wherein the inorganic matrix comprises at least one agglomerate type selected from the group consisting of silica agglomerates, basic silica agglomerates, acidic silica agglomerates, sodium waterglass agglomerates, potassium waterglass agglomerates, bromine agglomerates, iodine agglomerates, halogen agglomerates, carbon agglomerates, silicon agglomerates, germanium agglomerates, tin agglomerates, lead agglomerates, boron agglomerates, aluminum agglomerates, gallium agglomerates, indium agglomerates, phosphorus agglomerates, arsenic agglomerates, antimony agglomerates, sulfur agglomerates, selenium agglomerates, tellurium agglomerates, bismuth agglomerates.

10. The process as claimed in claim 8, wherein the organic network comprises at least one crosslinked component selected from the group consisting of polyamide component, polyacrylate component, polyol component, polyester component, polyhexoses component, polyaminoacids component, swellable polyhexoses component, red algae extract, agar, corn starch, potato starch, starch, carrageenan, tragacanth, swellable polysaccharide, gum arabic, alginates, pectin, swellable polypeptide, gelatin, carboxymethyl cellulose, hydroxyethyl cellulose, polyacrylics, polycarboxylic acids, polyethers, polyamides, polyimides, organosilicon compound having a methacrylic-acid-base polymerizable side group, organosiloxane.

11. The process as claimed in claim 4, wherein as the concomitant reaction at least one reaction is performed which is selected from the group consisting of oxidation with a halogen, oxidation under UV irradiation, oxidation under UV irradiation with wavelengths of less than 385 nm, oxidation under UV irradiation with a deuterium lamp, oxidation under UV irradiation with a UV LED at 365 nm, oxidation with atmospheric oxygen, oxidation under UV irradiation with a mercury vapor lamp, oxidation under UV irradiation with wavelengths around 254 nm, oxidation under UV irradiation with wavelengths around 185 nm, crosslinking and oxidation under UV irradiation, liberation of organic acids by condensation, liberation of organic alcohols by condensation, liberation of alcohols by oxide formation.

12. The process as claimed in claim 4, before or during the hardening nanoscale polyions are introduced, wherein the polyions comprise at least one type of polyions selected from the group consisting of polyhalide ions, interhalide ions, polysulfide ions, poly-iodine iodide ions, conjugated carbon ions, graphene ions, CNT ions.

13. The process as claimed in claim 12, wherein the length of the polyions is adjusted to an average chain length.

14. The process as claimed in claim 4, wherein a PV-active layer comprises at least partially a type of carrier molecule, the carrier molecule selected from the group consisting of ion-accepting scaffold polymers, Li-ion accepting scaffold polymers, ion-exchanging resins, ion-exchanging polymers, ion-exchanging glasses, halogen-ion-exchanging glasses, halogen-ion-exchanging silicates, iodophores.

15. The process as claimed in claim 4, wherein a PV-active layer comprises at least one further sensitizer.

16. The process as claimed in claim 4, wherein a concomitant reaction of a PV-active layer applied to a conductive component comprises a surficial oxidation of a metallic component.

17. The process as claimed in claim 16, wherein the oxidation comprises at least one reaction selected from the group consisting of formation of CuI on a particulate copper component, formation of Cu2O on a particulate copper component, formation of Ag2O on a conductive component, formation of ZnS on a metallic component, formation of SnO on a metallic component, formation of titanium-four oxide compounds on a conductive component, formation of titanium-four oxide compounds with low-valent metal oxide admixture.

18. The room temperature process for producing an electrotechnical, PV-active thin layer sequence as claimed in claim 1, wherein electrically conducting and/or semiconducting inorganic agglomerates are provided areally in a dispersion and hardened to afford a layer, characterized in that the hardening is performed at room temperature the hardening is accelerated by exposure to at least one reagent the process is performed in a printing machine a PV layer sequence is formed, wherein in turn a PV-active layer is formed on a carrier layer when a flowable, aqueous mixture or solution is provided, the mixture or solution comprises at least one inorganic agglomerate type which is selected from the group consisting of silica agglomerates, basic silica agglomerates, acidic silica agglomerates, sodium waterglass agglomerates, potassium waterglass agglomerates, halogen agglomerates, iodine agglomerates, wherein the mixture or solution comprises as a further constituent at least one organic, crosslinkable component whose crosslinkable molecule portion comprises at least one molecule portion selected from the group consisting of lactam portion, acrylic portion, polysaccharide portion, organosilicon compound having a polymerizable methacrylic-acid-based side group, organosiloxane, organosilyl acetate and the mixture or solution is applied by printing in a thin layer and finally hardened by concomitant reaction supported by UV irradiation and exposure to drying gas, wherein the PV-active layer forms an inorganic matrix having an interpenetrating organic network.

19. The room temperature process for producing an electrotechnical, PV-active thin layer sequence as claimed in claim 18, wherein electrically conducting and/or semiconducting inorganic agglomerates are provided areally in a dispersion and hardened to afford a layer, characterized in that in a printing machine a PV layer sequence is formed, wherein in turn a PV-active layer is formed on a carrier layer by providing a flowable aqueous mixture or solution a mixture or solution with mutually reacting components is made up, applied by printing in a thin layer and finally by continuing reaction is hardened, wherein the PV-active layer forms an inorganic matrix having an interpenetrating organic network with crosslinking binder bridges.

\* \* \* \* \*